United States Patent
Chen

(10) Patent No.: US 6,338,775 B1
(45) Date of Patent: Jan. 15, 2002

(54) APPARATUS AND METHOD FOR UNIFORMLY DEPOSITING THIN FILMS OVER SUBSTRATES

(75) Inventor: Jiong Chen, San Jose, CA (US)

(73) Assignee: Advanced Ion Beam Technology, Inc., Sunnyvale, CA (US)

( * ) Notice: Subject to any disclaimer, the term of this patent is extended or adjusted under 35 U.S.C. 154(b) by 0 days.

(21) Appl. No.: 09/633,428

(22) Filed: Aug. 7, 2000

(51) Int. Cl.$^7$ .................. C23C 14/00; C23C 14/50
(52) U.S. Cl. .............. 204/192.11; 204/192.12; 204/192.13; 204/298.03; 204/298.04; 204/298.11; 204/298.27; 204/298.28; 204/298.24; 118/730; 118/720; 118/665; 118/688; 427/255.5; 427/9
(58) Field of Search .............. 204/192.11, 192.12, 204/192.13, 298.03, 298.04, 298.11, 298.27, 298.28, 298.29; 118/730, 720, 665, 688; 427/255.5, 9

(56) References Cited

U.S. PATENT DOCUMENTS

| | | | | | |
|---|---|---|---|---|---|
| 4,108,751 | A | * | 8/1978 | King | 204/192.11 |
| 4,381,453 | A | * | 4/1983 | Cuomo et al. | 204/192.11 |
| 4,816,133 | A | * | 3/1989 | Barnett | 118/730 |
| 6,045,671 | A | * | 4/2000 | Wu et al. | 204/298.11 |

FOREIGN PATENT DOCUMENTS

JP 1-239028 * 3/1988 ................. 118/665

* cited by examiner

Primary Examiner—Rodney G. McDonald
(74) Attorney, Agent, or Firm—Bo-In Lin

(57) ABSTRACT

A thin film deposition apparatus and method are disclosed in this invention. The method includes a step of providing a vacuum chamber for containing a thin-film particle source for generating thin-film particles to deposit a thin-film on the substrates. The method further includes a step of containing a substrate holder in the vacuum chamber for holding a plurality of substrates having a thin-film deposition surface facing the thin-film particle source. The method further includes a step of providing a rotational means for rotating the substrate holder to rotate each of the substrates exposed to the thin-film particles for depositing a thin film thereon. And, the method further includes a step of providing a lateral moving means for laterally moving and controlling a duration of exposure time across a radial direction for each of the substrates for controlling thickness uniformity of the thin-film deposited on each of the substrates.

24 Claims, 2 Drawing Sheets

APPARATUS AND METHOD FOR UNIFORMLY DEPOSITING THIN FILMS OVER SUBSTRATES

BACKGROUND OF THE INVENTION

1. Field of the Invention

The invention disclosed herein relates generally to method and apparatus for thin film deposition on optical thin film substrates, semiconductor wafers, and magnetic storage devices. More particularly, this invention relates to an improved apparatus and method for more uniformly depositing thin films on semiconductor wafers with materials sputtered from targets by collision of high-energy ion beams.

2. Description of the Prior Art

Several difficulties have been encountered by those of ordinary skill in the art for applying conventional apparatuses and methods for carrying out the task of thin film deposition on substrates, such as the optical thin film and the semiconductor wafers. Specifically, even that the thin-film thickness may be critical for narrow band optical filters and integrated-circuit manufacture; a high degree of thin-film uniformity is not easily achievable. Furthermore, the uniformity of thin-film thickness is generally not measured and also difficult to control. Many methods and apparatuses have been employed to produce multiple layers of thin films in the processes of manufacturing semiconductor devices, dielectric filters, highly reflective mirrors, magnetic storage devices and other applications. A typical sputtering deposition system is contained in a vacuum chamber where a target material is impacted by ion beams to sputter material off the target by collision mechanisms. The sputtered material is deposited onto a substrate to form a thin film.

The conventional thin film deposition apparatuses can be applied for thin film deposition on a single or multiple substrates. The single substrate thin-film deposition system typically provides a rotational carrier to rotate the single substrate along a rotational axis while the target materials are sputtering onto the surface of the substrate to uniformly deposit the thin film on surface of the rotating substrate. For a multiple substrate deposition system, a common rotational carrier is used that has several single substrate holders. The common carrier is rotating along a central axis while each substrate holder is also rotating each single substrate along a holder axis such that the thin-film may be uniformly deposited onto several substrates because every part of these substrates would have equal time of deposition time for thin-film deposition during these rotation movements. However, as a more stringent requirement is imposed on the thickness-uniformity, the conventional methods of deposition are often unable to satisfy a reduced tolerance limit of the film-thickness variances. Furthermore, a technique to monitor and control the deposition process to achieve a predefined requirement of thickness uniformity is not available. The state of the art in film deposition technology thus limits a person of ordinary skill in the art to achieve higher thickness uniformity when systems and methods currently available are applied to carry out the thin-film deposition processes.

For the above reasons, a need still exists in the art of thin-film deposition to provide a new and improved apparatus and method for improving the uniformity in thin film deposition. A method to monitor and control the deposition process to improve the thickness uniformity is also required to overcome the limitations and difficulties faced by the traditional techniques of thin film deposition.

SUMMARY OF THE PRESENT INVENTION

It is the object of the present invention to provide a new system configuration and method for carrying out the thin film deposition process by monitoring and more precisely control the motion of the substrates for thin film deposition. Specifically, it is the object of the present invention to present a new system configuration of thin film deposition by moving the substrates in rotational and lateral movements. The speed of the lateral movement is further controlled by applying the measurements of thin-film thickness to assure high uniformity of thin-film thickness is achieved by changing the speed of the lateral movements depending on the thickness measurements. With the new and improved system configuration and method of operations, the difficulties of the prior art systems and methods are resolved. More uniform thin films have been produced for optical filter manufacture and IC device manufacture.

A thin film deposition apparatus and method are disclosed in this invention. The method includes a step of providing a vacuum chamber for containing a thin-film particle source for generating thin-film particles to deposit a thin-film on the substrates. The method further includes a step of containing a substrate holder in the vacuum chamber for holding a plurality of substrate having a thin-film deposition surface facing the thin-film particle source. The method further includes a step of providing a rotational means for rotating the substrate holder to rotate each of the substrates exposed to the thin-film particles for depositing a thin film thereon. And, the method further includes a step of providing a laterally moving means for laterally moving and controlling a duration of exposure time across a radial direction for each of the substrates for controlling a thickness uniformity of the thin-film deposited on each of the substrates.

A preferred embodiment of this invention discloses a thin film deposition apparatus for performing a thin-film deposition on a plurality of semiconductor substrates. The apparatus includes a vacuum chamber containing a thin-film particle source for generating thin-film particles to deposit a thin-film won the substrates. The apparatus further includes a substrate holder disposed in the vacuum chamber for holding a plurality of substrate each having a thin-film deposition surface facing the thin-film particle source. The apparatus further includes a rotational means for rotating the substrate holder to rotate each of the substrates exposed to the thin-film particles for depositing a thin film thereon. The apparatus further includes a laterally moving means for laterally moving the substrate holder and controlling a duration of thin-film particle exposure time across a radial direction for each of the substrates for controlling a thickness uniformity of the thin-film deposited on each of the substrates.

These and other objects and advantages of the present invention will no doubt become obvious to those of ordinary skill in the art after having read the following detailed description of the preferred embodiment which is illustrated in the various drawing figures.

DETAILED DESCRIPTION OF THE METHOD

Figure 1:
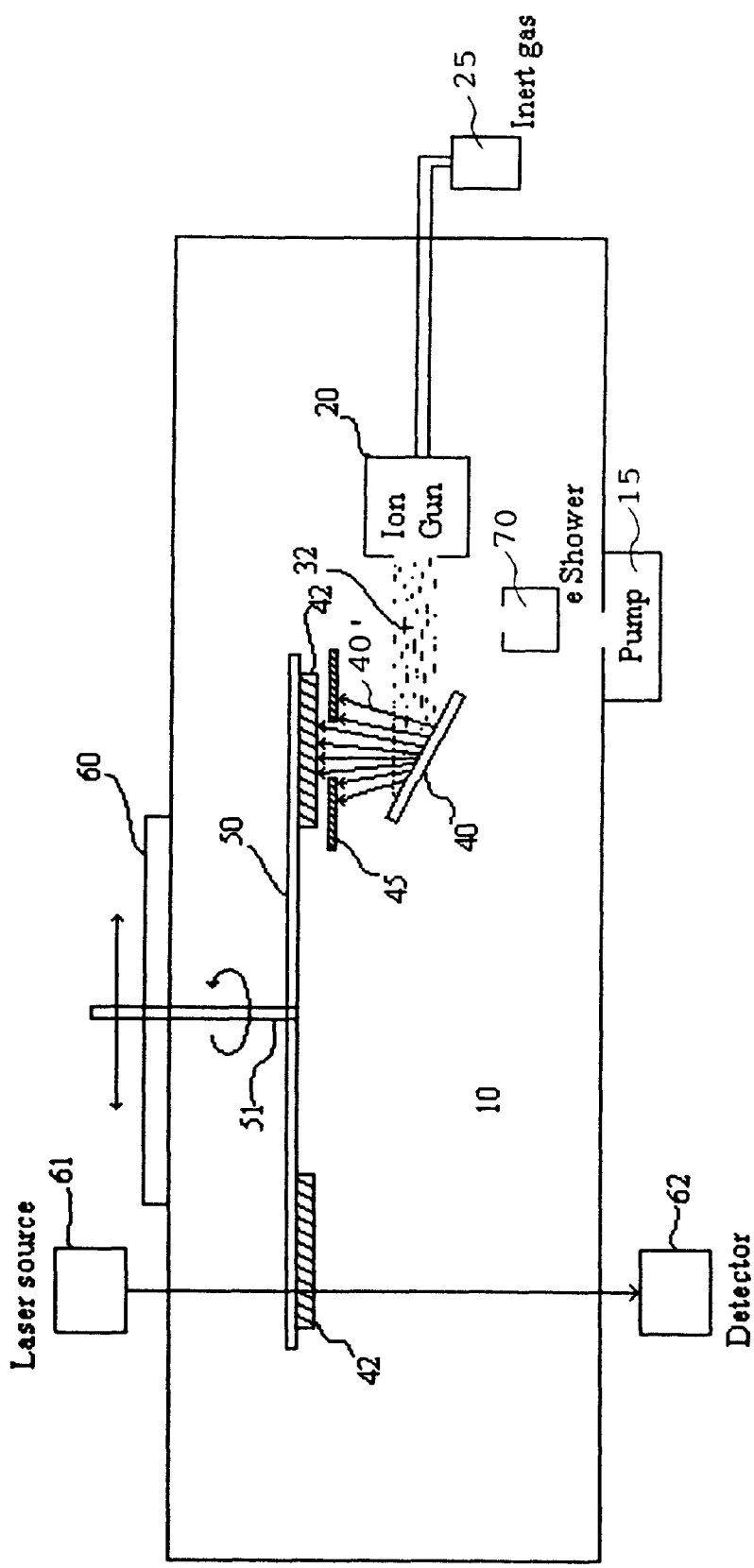
FIG. 1 is a functional block diagram of a thin-film deposition system of this invention.

The present invention teaches a novel and improved thin-film deposition apparatus and method by employing a thickness detector to continuously monitor the thickness of the thin-film during a deposition process and applying combined rotational-and-lateral movements with controllable speed to control the uniformity of the thin-film thickness. FIG. 1 is a diagram for illustrating the system configuration for carrying out a thin-film deposition process provided with capabilities to control the uniformity of thin-film thickness. A vacuum chamber 10 for containing the thin-film deposition system is evacuated to a low air pressure by applying a vacuum pump 15. The ion guns 20 disposed inside the vacuum chamber 10 are supplied with inert gas from an inert gas source 25 to produce a positively charged ion beam 32. The targets 40 employed for thin film deposition are held at an acute angle to the ion beam 32 The ion beam impinges onto the targets 40 made of a thin-film deposition material for sputtering particles off from the targets 40 with the particles project to the direction shown as arrows in FIG. 1. The particles 40' sputtered off from the targets 40 are directed toward a mask 45, which defines the particle stream shape before the particles reaching the substrate 42. The disk 50 rotates along a rotational axial shaft 51 at a high speed. The axial shaft 51 attached securely to the rotation disk 50 is fastened to a vacuum-sealed slider 60 and the vacuum-sealed slider 60 is controlled to move along lateral directions as by the arrows 60'. An optical monitoring system that includes a laser source 61 and a detector 62 are employed to measure the film thickness deposited on the substrate 42. As the ion beam 32 is positively charged, an electron shower 70 is applied to generate low energy electrons to neutralize the space charges induced by the ion beam 32 floating in the space inside the vacuum chamber 10 as positively charged particles.

Figure 2:
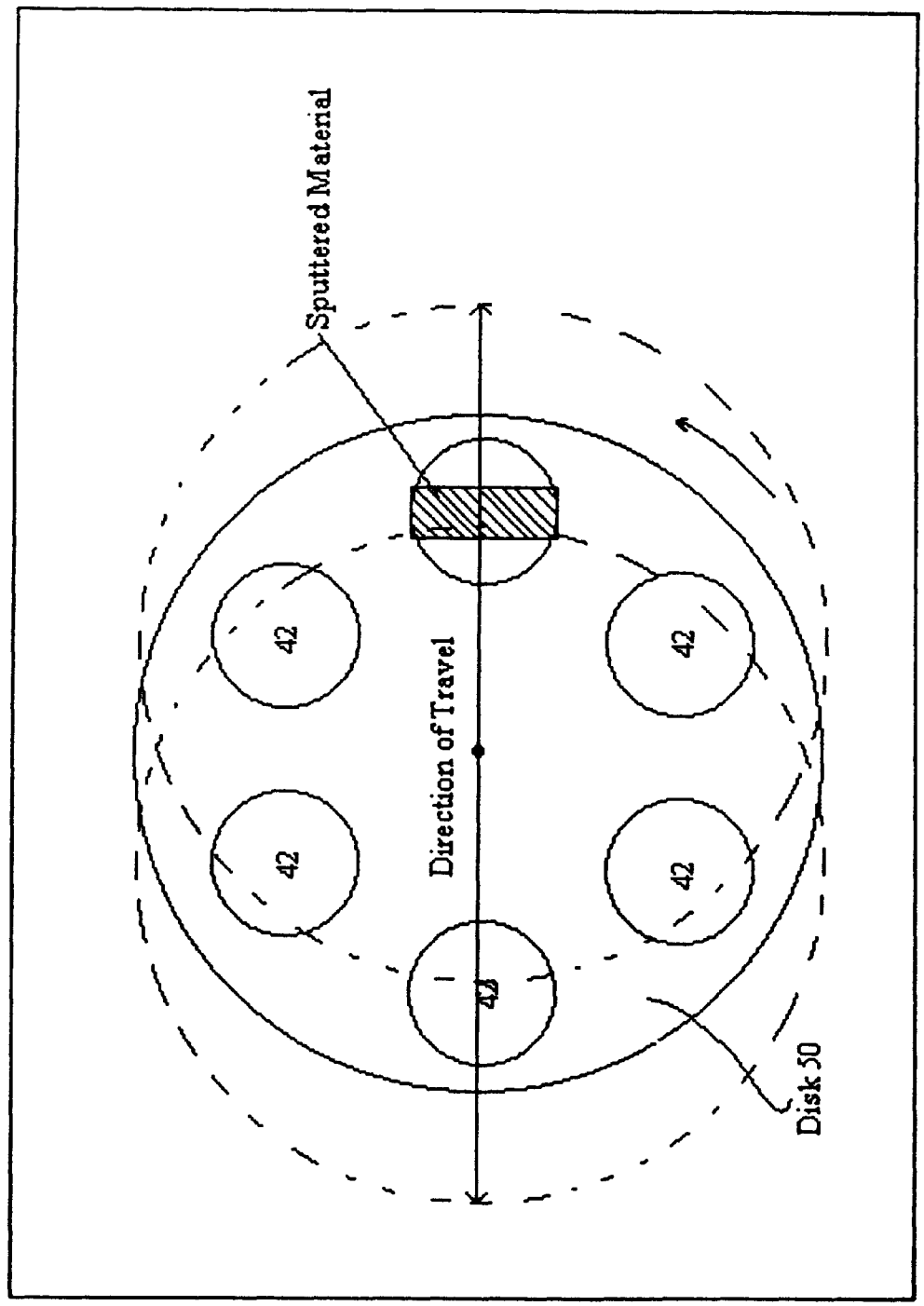
FIG. 2 is a top view for showing the rotational and lateral movements of a disk for holding a plurality of substrates for carrying out a thin film deposition process.

FIG. 2 shows a top view of the disk 50 that holds several substrates 42 for thin film deposition. The disk 50 is controlled to rotate along the axial shaft 51 and also to move the substrates 42 laterally in and out of the stream of the sputtered particles 40'. Depending on the measured thickness of thin-films deposited onto the substrate 42, the speed of lateral movement is adjusted to further improve the deposition process so that thin films with uniform thickness are deposited onto each and every substrate 42. In a thin film deposition process, several substrates 42 are placed onto the disk 50. The vacuum chamber 10 is closed and sealed. The evacuation pump 15 is turned on to evacuate the vacuum chamber to a pre-set air pressure suitable for thin-film deposition operation. The inert gas is supplied to the ion guns 20 to generate ion beam 32. The ion beam 32 projected to the targets 40 to sputter thin film particles 40' with a portion of the thin-film particles 40' pass through the mask 45 for depositing onto the substrate 42. A rotation speed in the order of one thousand rotation per minute (1000 rpm) or higher is applied to the wafer holding disk 50 to assure uniform film thickness is achieved. The thickness detection system 61 and 62 are implemented to measure a radial thickness profile across each substrate 42. Based on the measurements, the disk 50 is controlled to move laterally in a lateral direction as that shown in FIG. 2 at a particular speed to improve the uniformity of film-thickness by controlling the durations of time the substrate 42 is exposed to the sputtered thin-film particles 40'. A faster lateral movement is activated when a greater film thickness is measured at certain lateral locations. Improved film-thickness uniformity is therefore achieved with this new system and method of thin film deposition.

Therefore, the present invention provides a new system configuration and method for carrying out the thin film deposition process by monitoring and precisely controlling the lateral motion of the substrates for thin film deposition. By moving the substrates in rotational and lateral movements and by controlling the speed of the lateral movement using the measurements of thin-film thickness, high uniformity of thin-film thickness is achieved. The speed of the lateral movements may be changed depending on the thickness measurements to assure that high degree of thickness uniformity is produced. With the new and improved system configuration and method of operations, the difficulties of the prior art systems and methods are resolved. More uniform thin films are now available to provide better and more reliable optical devices and semiconductor integrated circuit (IC) devices.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly it is intended that the appended claims be interpreted as covering all alterations and modifications as fall within the true spirit and scope of the invention.

I claim:

1. A method for performing a thin film deposition on a plurality of semiconductor substrates comprising:

providing a vacuum chamber for containing a thin-film particle source for generating thin-film particles to project toward said substrates over a particle exposure area to deposit a thin-film on said substrates;

containing a substrate holder in said vacuum chamber for holding a plurality of substrates having a thin-film deposition surface facing said thin-film particle source;

providing a rotational means for rotating said substrate holder to rotate each of said substrates for rotationally moving each of said substrates across said particle exposure area for depositing a thin film thereon; and providing a horizontal moving means for horizontally moving said substrate holder laterally across said particle exposure area and controlling a lateral speed of said substrate holder moving across said particle exposure area for controlling a thickness uniformity of said thin-film deposited on each of said substrates.

2. The method of performing thin-film deposition of claim 1 further comprising a step of:

providing an ion gun for projecting a plurality of ions to a thin film target for generating said thin-film particles and providing an electron shower between said ion gun and said thin-film target for neutralizing space charges generated by said plurality of ions projected to said thin-film target.

3. The method of performing thin-film deposition of claim 1 further comprising a step:

providing a thickness measuring means for measuring a thin-film thickness of said substrates for controlling said horizontal moving means for controlling a lateral speed of said substrate holder moving across said particle exposure area for controlling a thickness uniformity of said thin-film deposited on each of said substrates.

4. The method of performing thin-film deposition of claim 1 wherein:

said providing a horizontal moving means for horizontally moving said substrate holder comprises a step of providing a moving means for moving said substrate holder along a line substantially perpendicular to a rotation axis of said substrate holder and controlling a lateral speed of said substrate holder moving across said particle exposure area for controlling a thickness uniformity of said thin-film deposited on each of said substrates.

5. The method of performing thin-film deposition of claim 3 wherein:
said providing a horizontal moving means for horizontally moving said substrate holder comprises a step of providing a moving means for moving said substrate holder along a line substantially perpendicular to a rotation axis of said substrate holder and controlling a lateral speed of said substrate holder moving across said particle exposure area based on said thin film thickness measured by said thickness measuring means for controlling a thickness uniformity of said thin-film deposited on each of said substrates.

6. The method of performing a thin-film deposition of claim 1 wherein:
said containing a thin-film particle source for generating thin-film particles further comprises a step of bombarding a thin-film target with an ion beam for knocking off said thin film particles from said thin-film target for projecting said thin-film particles toward said substrates over said particle exposure area to deposit a thin-film on said substrates.

7. The method of performing a thin-film deposition of claim 6 wherein:
said step of bombarding said thin-film target with an ion beam for knocking off said thin film particles from said thin-film target comprises a step of employing an ion gun for projecting said ion beam to said thin-film target.

8. The method of performing thin film deposition of claim 1 wherein:
said containing a thin-film particle source for generating said thin-film particles further comprises a step of disposing a thin-film particle mask with a particle-slit in said particle exposure area for passing said thin film particles from said particle-slit to deposit a thin-film on said substrates.

9. The method of performing thin-film deposition of claim 7 wherein:
said step of employing an ion gun for projecting said ion beam to said thin-film target further comprising a step of introducing an inert gas to said vacuum chamber for said ion gun to generate said ion beam.

10. The method of performing a thin-film deposition of claim 1 wherein:
said providing a vacuum chamber for containing a thin-film particle source further comprises a step of providing said vacuum chamber with a vacuum in the range of $10^{-5}$ Torr in said vacuum chamber.

11. A method for performing a thin-film deposition from a thin-film particle source onto a substrate held on a substrate holder comprising:
providing a moving means for simultaneously rotating said substrate and generating a relative linear motion along a surface direction of said substrate between said substrate holder and a particle exposure area projected to said substrate holder from said thin-film particle source for moving said substrate across said particle exposure area and controlling a deposition thickness over said substrate.

12. The method of claim 11 further comprising:
providing a rotation means for rotating said substrate holder along an axis substantially parallel to a direction projecting from said thin-film particle source to said substrate holder.

13. A thin film deposition apparatus for performing a thin-film deposition on a plurality of semiconductor substrates comprising:
a vacuum chamber containing a thin-film particle source for generating thin-film particles projected toward said substrates over a particle exposure area to deposit a thin-film on said substrates;
a substrate holder disposed in said vacuum chamber for holding a plurality of substrates each having a thin-film deposition surface facing said thin-film particle source;
a rotational means for rotating said substrate holder to rotate each of said substrates for rotationally moving each of said substrates across said particle exposure area for depositing a thin film thereon; and
a horizontal moving means for horizontally moving said substrate holder laterally across said particle exposure area and controlling a lateral speed of said substrate holder moving across said particle exposure area for controlling a thickness uniformity of said thin-film deposited on each of said substrates.

14. The thin-film deposition apparatus of claim 13 further comprising:
an ion gun for projecting a plurality of ions to a thin film target for generating said thin-film particles; and
an electron shower disposed between said ion gun and said thin-film target for neutralizing space charges generated by said plurality of ions projected to said thin-film target.

15. The thin-film deposition apparatus of claim 13 further comprising:
a thickness measuring means for measuring a thin-film thickness of said substrates for controlling said horizontal moving means for controlling a lateral speed of said substrate holder moving across said particle exposure area for controlling a thickness uniformity of said thin-film deposited on each of said substrates.

16. The thin-film deposition apparatus of claim 13 wherein:
said horizontal moving means for horizontally moving said substrate holder further comprising a moving means for moving said substrate holder along a line substantially perpendicular to a rotation axis of said substrate holder and controlling a lateral speed of said substrate holder moving across said particle exposure area for controlling a thickness uniformity of said thin-film deposited on each of said substrates.

17. The thin-film deposition apparatus of claim 15 wherein:
said horizontal moving means for horizontally moving said substrate holder further comprising a moving means for moving said substrate holder along a line substantially perpendicular to a rotation axis of said substrate holder and controlling a lateral speed of said substrate holder moving across said particle exposure area based on said thin film thickness measured by said thickness measuring means for controlling a thickness uniformity of said thin-film deposited on each of said substrates.

18. The thin-film deposition apparatus of claim 13 wherein:
said thin-film particle source for generating thin-film particles further comprising an ion beam means and a thin-film target bombarded by an ion beam generated from said ion beam means for knocking off said thin film particles from said thin-film target for projecting said thin-film particles toward said substrates over said particle exposure area to deposit a thin-film on said substrates.

19. The thin-film deposition apparatus of claim 18 wherein:

said ion beam means further comprising an ion gun for projecting an ion beam to said thin-film target for bombarding said thin-film target with said ion beam for knocking off said thin film particles from said thin-film target.

20. The thin-film deposition apparatus of claim 13 wherein:

said thin-film particle source for generating said thin-film particles further comprising a thin-film particle mask disposed in said particle exposure area wherein said thin-film particle mask having a particle-slit for passing said thin film particles from said particle-slit to deposit a thin-film on said substrates.

21. The thin-film deposition apparatus of claim 19 wherein:

said ion gun for projecting said ion beam to said thin-film target further comprising an inert gas source to introduce an inert gas into said vacuum chamber for said ion gun to generate said ion beam.

22. The thin-film deposition apparatus of claim 13 wherein:

said vacuum chamber for containing said thin-film particle source further comprising a vacuum means for generating a vacuum in the range of $10^{-5}$ Torr in said vacuum chamber.

23. A thin-film deposition apparatus for depositing a thin-film from a thin-film particle source onto a substrate held on a substrate holder comprising:

a moving means for simultaneously rotating said substrate and generating a relative linear motion along a surface direction of said substrate between said substrate holder and a particle exposure area projected to said substrate holder from said thin-film particle source for moving said substrate across said particle exposure area and controlling a deposition thickness over said substrate.

24. The apparatus of claim 23 further comprising:

a rotation means for rotating said substrate holder along an axis substantially parallel to a direction projecting from said thin-film particle source to said substrate holder.

* * * * *